US011561876B2

(12) United States Patent
Rasmussen

(10) Patent No.: US 11,561,876 B2
(45) Date of Patent: Jan. 24, 2023

(54) FAIL COMPARE PROCEDURE

(71) Applicant: Micron Technology, Inc., Boise, ID (US)

(72) Inventor: Phillip A. Rasmussen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 79 days.

(21) Appl. No.: 17/152,039

(22) Filed: Jan. 19, 2021

(65) Prior Publication Data

US 2022/0229751 A1 Jul. 21, 2022

(51) Int. Cl.
*G06F 11/30* (2006.01)
*G06F 11/263* (2006.01)
*G06F 16/23* (2019.01)

(52) U.S. Cl.
CPC ........ *G06F 11/263* (2013.01); *G06F 16/2379* (2019.01)

(58) Field of Classification Search
CPC ............................ G06F 11/263; G06F 16/2379
See application file for complete search history.

(56) References Cited

U.S. PATENT DOCUMENTS

| | | | | |
|---|---|---|---|---|
| 7,620,515 | B2* | 11/2009 | Heinen | G01R 31/3171 |
| | | | | 702/118 |
| 10,613,927 | B1* | 4/2020 | Symons | H03M 13/45 |
| 10,944,424 | B1* | 3/2021 | Wang | H04L 1/005 |
| 11,209,482 | B1* | 12/2021 | Sharma | G01R 31/3193 |
| 2018/0024881 | A1* | 1/2018 | Lu | H03M 13/3723 |
| | | | | 714/764 |
| 2021/0224149 | A1* | 7/2021 | Dietrich | G06F 11/1004 |

* cited by examiner

*Primary Examiner* — Matthew M Kim
*Assistant Examiner* — Kyle Emanuele
(74) *Attorney, Agent, or Firm* — Holland & Hart LLP

(57) ABSTRACT

Methods, systems, and devices for a fail compare procedure are described. An apparatus may include a host device coupled with a memory device. An application specific integrated circuit (ASIC) associated with the host device (e.g., included in, coupled with) may include a set of comparators that output first bit information that includes respective states of at least two bits of data read from the memory device. The host device may compare (e.g., at the ASIC) the first bit information to second bit information that includes respective expected states of the at least two bits. Based on the comparison, the host device may determine whether a state of at least one bit of the first bit information is different than a state of a corresponding bit of the second bit information, and may output one or more signals including indications of a fail to a counter of the ASIC.

22 Claims, 5 Drawing Sheets

FAIL COMPARE PROCEDURE

FIELD OF TECHNOLOGY

The following relates generally to one or more systems for memory and more specifically to a fail compare procedure.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
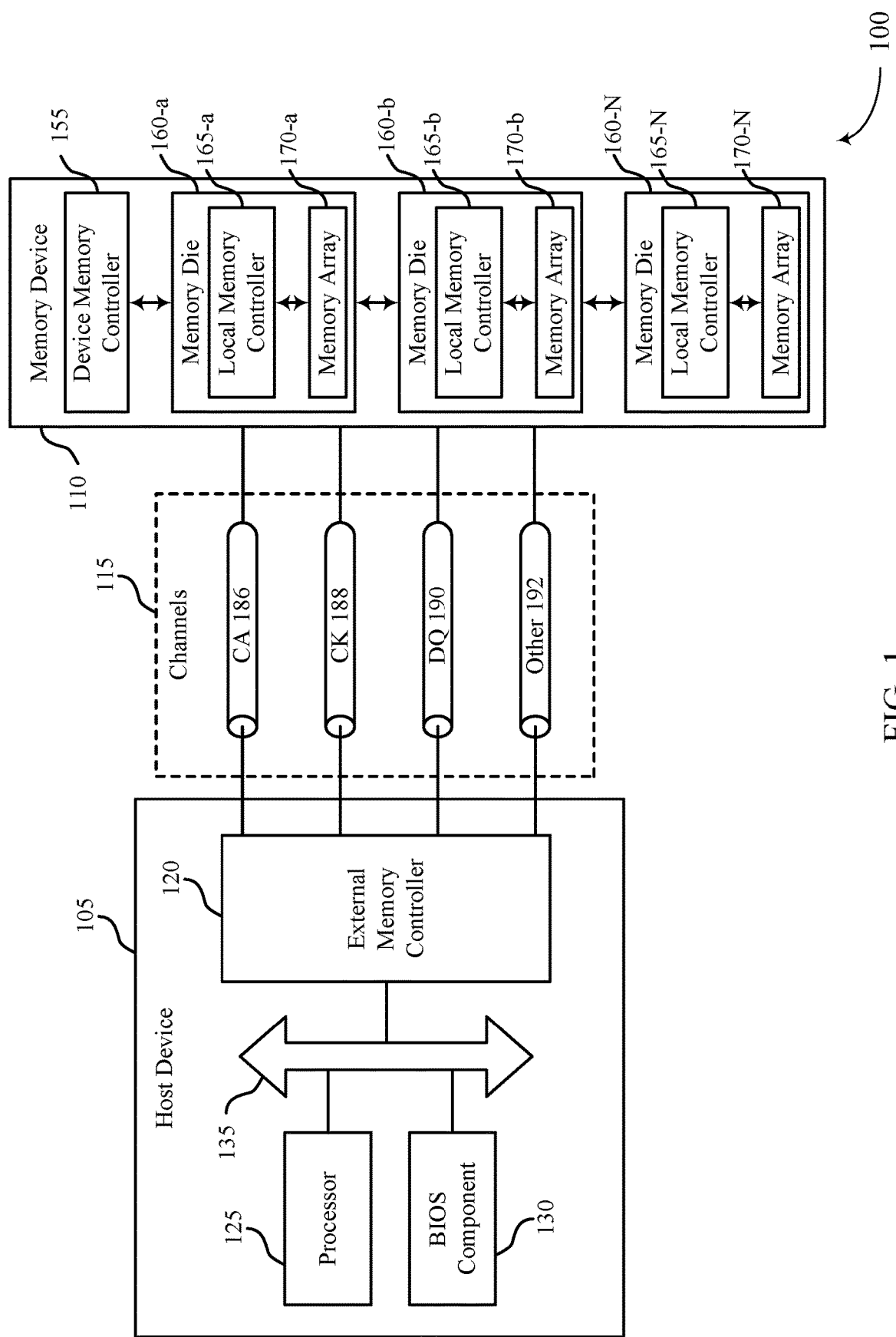
FIG. 1 illustrates an example of a system that supports a fail compare procedure in accordance with examples as disclosed herein.

A host device may communicate data with a memory device that is coupled with the host device. For example, a host device may write data to or read data from memory cells of a memory device, among other operations. In some examples, a signal (e.g., a read signal, a write signal) may be a multi-level signal that is modulated to represent more than one bit of data. To read a multi-level signal, the host device may use a set of comparators to compare the signal to various reference voltages and determine states of bits corresponding to the signal (e.g., '00', '01', '10', '11'). In some cases, the host device may compare data read from the memory device to expected data corresponding to the data read from the memory device to determine whether the data is correctly read (e.g., during a testing phase of operation). In some cases, the host device may input the data read from the memory device and the expected data into one or more exclusive-or (XOR) gates to determine whether the data is correctly read. If at least one state of a bit read from the memory device is different than a state of a corresponding bit of the expected data, the host device may determine that at least one comparator of the set of comparators failed. However, when using the XOR gates, the host device may not know which comparator(s) failed. To determine which comparator failed and to adjust a corresponding reference voltage used by the comparator, the host device may perform testing using one comparator at a time. But using one comparator at a time may increase latency associated with testing the comparators. Additionally, using one comparator at a time may increase complexity of the testing as data read using one comparator may be different than the corresponding expected data. Thus, different sets of expected data may be generated to test each comparator.

Techniques, systems, and devices are described for verifying data read from a memory device using one or more lookup tables. Verifying data read from a memory device using one or more lookup tables may decrease latency and complexity associated with characterizing or adjusting the performance of the set of comparators (e.g., determining or adjusting reference voltages used by the set of comparators, determining or adjusting sample times of signals input into the set of comparators, or other parameters associated with the performance of the set of comparators) used to receive the data read from the memory device. For example, a host device may receive signaling including bit information from a set of comparators (e.g., comparators included in an application specific integrated circuit (ASIC) included in or coupled with the host device) corresponding to data read from the memory device. The bit information may include respective states of at least two bits of data. The host device may compare (e.g., at the ASIC) the bit information to expected bit information corresponding to the bit information using a lookup table, where the expected bit information includes respective expected states of the at least two bits. Using the lookup table, the host device may determine whether a state of at least one bit of the bit information is different than a state of a corresponding bit of the expected bit information. Based on the comparison, the host device may output one or more signals including indications of a fail to a counter of the ASIC.

The host device may program the lookup table to disregard some bit failures and count other bit failures. For example, the host device may program the lookup table such that the counted bit failures characterize the performance of a particular comparator. Additionally, or alternatively, the host device may compare the bit information to the expected bit information using multiple lookup tables that are each programmed to disregard different bit failures and characterize the performance of a corresponding comparator. In this way, the host device may concurrently characterize the performance of each comparator of the set of comparators, thereby reducing latency. Additionally, the host device may decrease test complexity because the data is read using the set of comparators (e.g., rather than one comparator) and thus, a same set of expected bit information may be used to characterize each comparator.

Features of the disclosure are initially described in the context of systems and dies as described with reference to FIG. 1. Features of the disclosure are described in the context an eye diagram and circuits as described with reference to FIGS. 2-3B. These and other features of the disclosure are further illustrated by and described with reference to an apparatus diagram and flowcharts that relate to fail compare procedure as described with reference to FIGS. 4 and 5.

FIG. 1 illustrates an example of a system 100 that supports a fail compare procedure in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an ASIC, a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa. In some examples, the external memory controller 120 may include or be coupled with an ASIC. The ASIC may include a set of comparators used to determine bit information corresponding to data read from the memory device 110.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, the host device 105 may compare data read from the memory device 110 to expected data corresponding to the data to verify the data (e.g., during a testing phase of operation). In some cases, the host device 105 may use one or more XOR gates to determine whether the data is correctly read. By verifying the data, the host device 105 may characterize and adjust the performance of the set of comparators (e.g., determine or adjust reference voltages used by the set of comparators, determine or adjust sample times of signals input into the set of comparators, or other parameters associated with the performance of the set of comparators) included in the ASIC associated with the external memory controller 120.

However, using the XOR gates may increase latency and complexity associated with characterizing the performance of the set of comparators because the host device 105 may characterize the performance of each comparator one at a time and may use a different set of expected data to characterize the performance of each comparator.

To reduce latency and complexity associated with characterizing the performance of the set of comparators, the host device 105 may verify data read from the memory device 110 using one or more lookup tables. For example, the host device 105 may receive signaling including bit information from the set of comparators included in the ASIC that corresponds to data read from the memory device 110. The bit information may include respective states of at least two bits of data. The host device 105 may compare (e.g., at the ASIC) the bit information to expected bit information corresponding to the bit information using a lookup table, where the expected bit information includes respective expected states of the at least two bits. Using the lookup table, the host device 105 may determine whether a state of at least one bit of the bit information is different than a state of a corresponding bit of the expected bit information. Based on the comparison, the host device 105 may output one or more signals including indications of a fail to a counter of the ASIC.

The host device 105 may program the lookup table to disregard some bit failures and count other bit failures. For example, the host device 105 may program the lookup table such that the counted bit failures characterize the performance of a particular comparator. Additionally, or alternatively, the host device 105 may compare the bit information to the expected bit information using multiple lookup tables that are each programmed to disregard different bit failures and characterize the performance of a corresponding comparator. In this way, the host device 105 may concurrently characterize the performance of each comparator of the set of comparators, thereby reducing latency. Additionally, the host device 105 may reduce complexity associated with characterizing the set of comparators because the data is read using the set of comparators (e.g., rather than using one comparator) and thus, a same set of expected bit information may be used to characterize each comparator.

Figure 2:
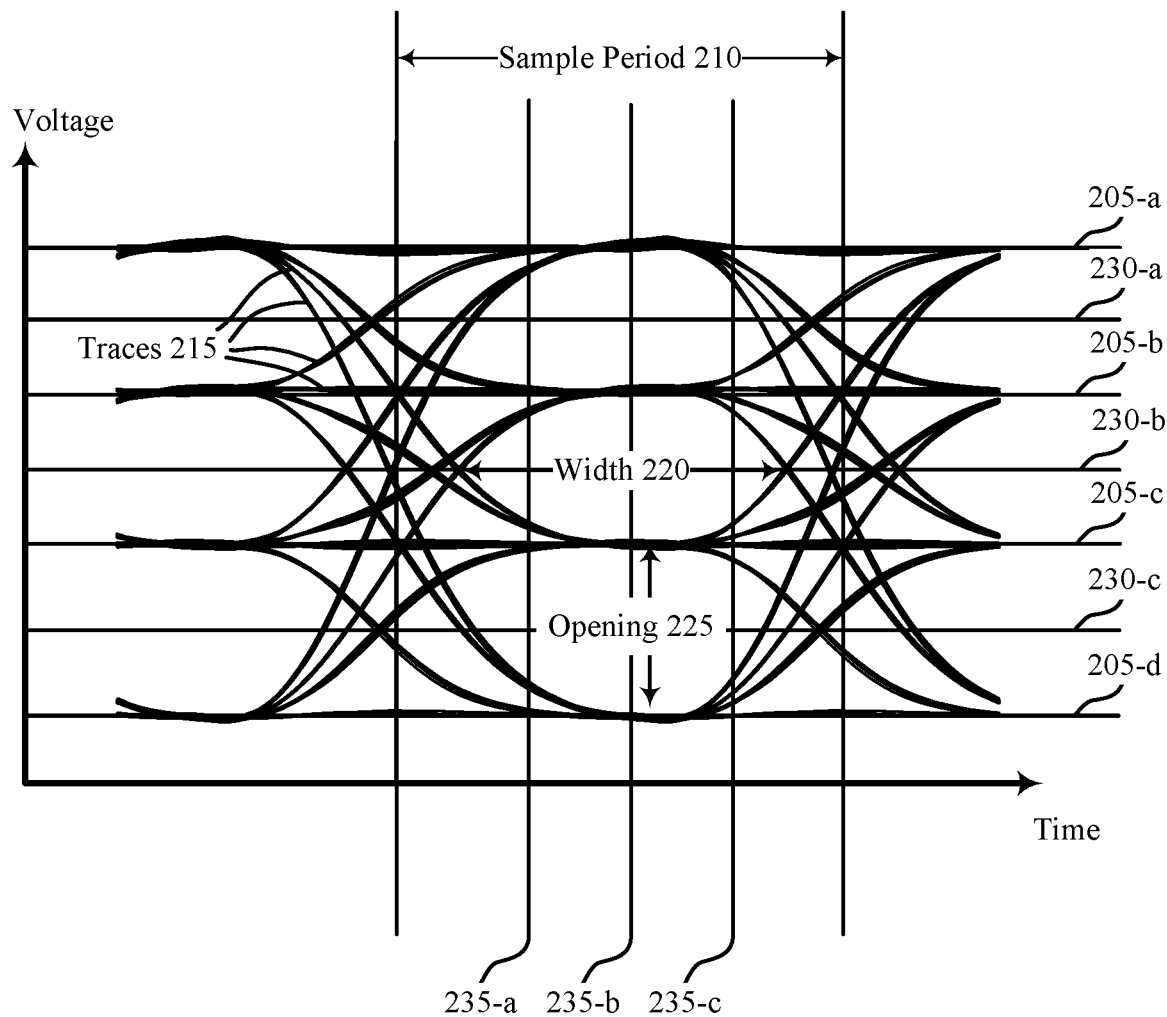
FIG. 2 illustrates an example of an eye diagram that supports a fail compare procedure in accordance with examples as disclosed herein.

FIG. 2 illustrates an example of an eye diagram 200 that supports a fail compare procedure in accordance with examples as disclosed herein. The eye diagram 200 may be used to indicate a quality of signals when reading data from a memory device (e.g., memory device 110) and may represent four symbols of a signal (e.g., '00', '01', '10', or '11'). In some examples, each of the four symbols may be represented by a different voltage amplitude (e.g., amplitudes 205-a, 205-b, 205-c, 205-d). In some examples, the eye diagram 200 may represent a PAM4 signal that may be used to communicate data between a host device and a memory device (e.g., host device 105 and memory device 110 as described with reference to FIG. 1). The eye diagram 200 may provide a visual indication of the health and integrity of a signal.

To generate the eye diagram 200, in some examples, an oscilloscope or other computing device may sample a digital signal according to a sample period 210 (e.g., a unit interval or a bit period). The sample period 210 may be defined by a clock associated with the transmission of the measured signal (e.g., the sample period 210 may span one cycle or period of the clock). In some examples, the oscilloscope or other computing device may measure the voltage level of the signal during the sample period 210 to form a trace 215. Noise and other factors can result in the traces 215 measured from the signal deviating from a set of ideal step functions. By overlaying a plurality of traces 215, various characteristics about the measured signal may be determined. For example, the eye diagram 200 may be used to identify a quantity of characteristics of a communication signal such as jitter, cross talk, electromagnetic interference (EMI), signal loss, signal-to-noise ratio (SNR), other characteristics, or combinations thereof. A closed eye may indicate a noisy and/or unpredictable signal or other problems.

In some examples, the eye diagram 200 may indicate a width 220. The width 220 of an eye in the eye diagram 200 may be used to indicate a timing synchronization of the measured signal or jitter effects of the measured signal. In some examples, comparing the width 220 to the sample period 210 may provide a measurement of SNR of the measured signal. Each eye in an eye diagram may have a unique width based on the characteristics of the measured signal. Various encoding and decoding techniques may be used to modify the width 220 of the measured signal.

In some examples, the eye diagram 200 may indicate an eye opening 225, which may represent a peak-to-peak voltage difference between the various amplitudes 205. The eye opening 225 may be related to a voltage margin for discriminating between different amplitudes 205 of the measured signal. The smaller the margin, the more difficult it may be to discriminate between neighboring amplitudes 205, and the more errors that may be introduced due to noise. In some cases, a receiver (e.g., receiver 305-a as described with reference to FIG. 3A below) of the signal may compare the signal to one or more threshold voltages positioned between the various amplitudes 205. In other cases, the larger the eye opening 225, the less likely it is that noise will cause the one or more voltage thresholds to be satisfied in error. The eye opening 225 may be used indicate an amount of additive noise in the measured signal, and may be used to determine a SNR of the measured signal. Various encoding and decoding techniques may be used to modify the eye opening 225 of the measured signal.

A signal may be encoded according to various schemes such that each amplitude 205 may be associated with a logic state of a memory cell (e.g., '00', '01', '10', '11'). For example, a signal may encoded according to a Gray coding scheme, a linear encoding scheme, or another encoding scheme. A Gray coding scheme may be defined such that logic states associated with successive amplitudes 205 differ in one bit. For example, according to a Gray coding scheme, amplitude 205-a may be associated with a logic state '10', amplitude 205-b may be associated with a logic state '11', amplitude 205-c may be associated with a logic state '01', and amplitude 205-d may be associated with a logic state '00'. A linear encoding scheme may be defined such that logic states associated with successive amplitudes 205 may increase in numerical value. For example, according to a linear encoding scheme, amplitude 205-d may be associated with a logic state '00', amplitude 205-c may be associated with a logic state '01', amplitude 205-b may be associated with a logic state '10', and amplitude 205-a may be associated with a logic state '11'.

To distinguish between different amplitudes 205 when decoding a signal, respective reference voltages 230 may be located between the different ideal amplitudes 205 associated with the traces 215. For example, reference voltage 230-a may be equidistant from amplitude 205-a and amplitude 205-b, reference voltage 230-b may be equidistant from amplitude 205-b and amplitude 205-c, and reference voltage 230-c may be equidistant from amplitude 205-c and amplitude 205-d. Thus, reference voltages 230-a, 230-b, and 230-c may represent examples of ideal, default, or operational reference voltages corresponding to centers of respective data eyes. In some examples, non-ideal reference voltages may be used to distinguish between different amplitudes 205.

When decoding user data (e.g., data for storing in a memory array) or commands, the signals represented by the traces 215 may be compared to a reference voltage 230 at a sampling time 235. For example, a sampler (e.g., of a host device 105 or a memory device 110) may sample a signal at sampling time 235. Sampling time 235-b, for example, may occur near the middle of the sample period 210, which may correspond to the temporal center of the data eyes. The voltage of the signal sampled at a sampling time 235 may be compared to a reference voltage 230 to determine a corresponding amplitude 205 and thus a logic state conveyed by the signal. A reference point within a time and voltage domain may represent a combination of a reference voltage 230 and a sampling time 235. For example, a reference point corresponding to reference voltage 230-*a* and a sampling time 235-*b* may represent an ideal, default, or operational reference point corresponding to the center of the data eye associated with reference voltage 230-*a* and thus corresponding to reference voltage 230-*a* at sampling time 235-*b*.

The nearer a reference point is to an edge of the data eye, the more likely that errors may occur when decoding a signal represented by the data eye. In operation, the data eye for signaling over a channel may vary, for example, due to cross coupling, noise, unstable voltages, and the like. For example, an error (e.g., an incorrect value) may be detected if a signal meant to convey the logic state associated with amplitude 205-*a* is below the reference voltage 230-*a* used by a sampler (e.g., of a host device) when a sampling time 235 occurs. As a result, the receiver may determine that the logic state associated with amplitude 205-*b* was signaled, even though the logic state associated with amplitude 205-*a* was intended.

A host device may sample a signal corresponding to data read from a memory device to determine a logic state conveyed by the signal. The host device may compare the determined logic state to an expected logic state for the data to verify whether the data was read correctly. The host device may compare the determined logic state to the expected logic state using one or more lookup tables. If the host device determines that the determined logic state does not match the expected logic state, the host device may adjust a reference voltage 230, or a sampling time 235, or both, used to determine the logic state conveyed by the signal.

Figure 3A:
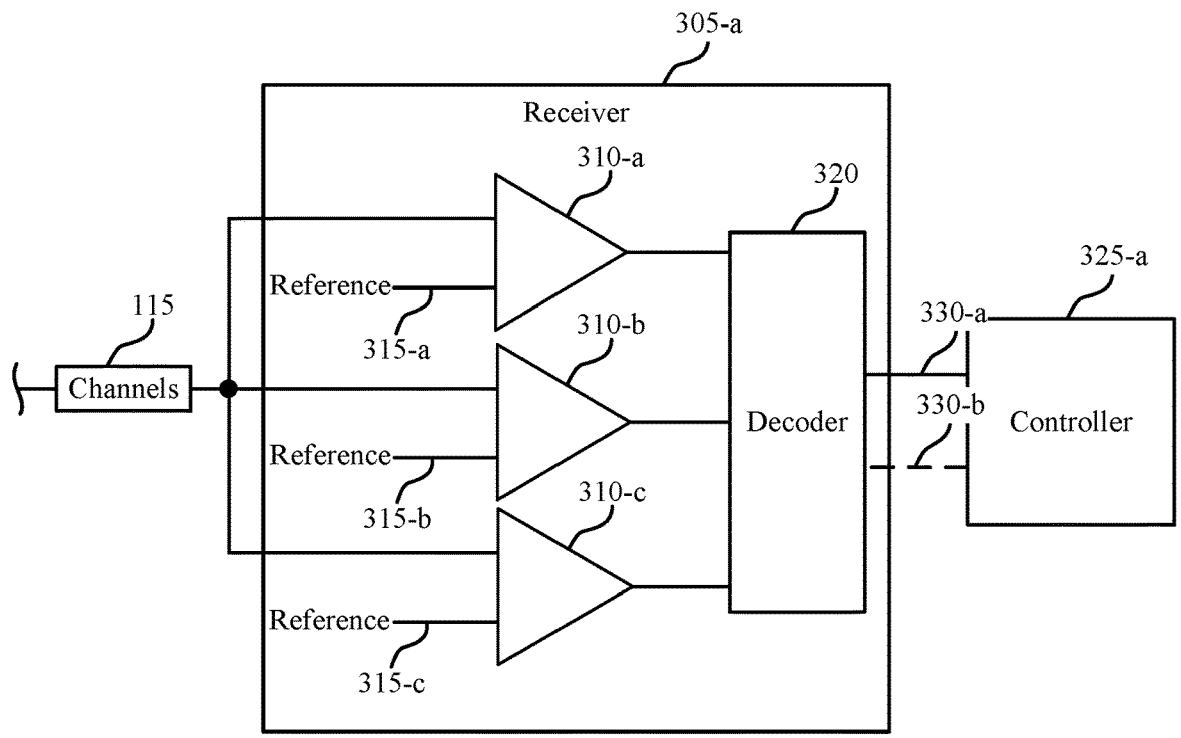
FIGS. 3A and 3B illustrate example circuits that support a fail compare procedure in accordance with examples as disclosed herein.

FIG. 3A illustrates an example of a circuit 300 that supports a fail compare procedure in accordance with examples as disclosed herein. The circuit 300 may include a receiver 305-*a* and a controller 325-*a*, which may be included in an ASIC that is coupled with or included in a host device 105 or an external memory controller 120 described with reference to FIG. 1. The receiver 305-*a* may be configured to receive and/or decode a multi-level signal. For example, the receiver 305-*a* may receive a signal using one or more channels (e.g., channels 115 described with reference to FIG. 1). The receiver 305-*a* may be configured to output two or more bits of data based on a received signal. The receiver 305-*a* may include a set of comparators 310 and a decoder 320.

The set of comparators 310 may be configured to compare the received signal to a set of reference voltages 315. The quantity of comparators 310 may be related to a quantity of symbols (e.g., amplitude levels) that may be represented in the received signal. For example, if the received signal is a multi-level signal configured to have four symbols (e.g., a PAM4 signal), the receiver 305-*a* may include three comparators 310-*a*, 310-*b*, 310-*c* and voltage sources providing three reference voltages 315-*a*, 315-*b*, 315-*c*.

Each comparator 310 may output a signal based on whether the received signal is greater than or less than the reference voltage 315. Said another way, a comparator 310 may determine whether the received signal satisfies a voltage threshold defined by the comparator 310 and its associated reference voltage 315. For example, the comparator 310 may output a high voltage if the received signal is greater than the associated reference signal 315 and the comparator 310 may output a low voltage if the received signal is less than the associated reference signal 315 (or vice-versa). The decoder 320 may receive the outputs of the comparators 310. The reference voltages 315 may be selected to discriminate between the expected amplitude levels of the received signal. For example, reference voltages 315 may be selected to be within an eye opening of an eye between two amplitude levels in an eye diagram (e.g., an eye opening 225 between amplitudes 205-*a* and 205-*b*, as described with reference to FIG. 2).

The decoder 320 may be configured to determine a logic state represented by the received signal based on the outputs of the comparators 310. The combination of the outputs of the comparators 310 may be used to determine an amplitude of the received signal, which may correspond to the logic state. Additionally, the decoder 320 may be configured to determine the logic state represented by the received signal based on an encoding scheme associated with the signal. For example, if the received signal is a PAM4 signal encoded according to a Gray coding scheme, the decoder 320 may determine a state of the most significant bit of the logic state based on the output of the comparator 310-*b*. In this example, the decoder 320 may determine a state of the least significant bit of the logic state by inputting the output of the comparator 310-*a* and the output of the comparator 310-*c* into an XOR gate. In some cases, the decoder 320 may be an example of a look-up table that indexes the outputs of the comparators 310 to logic states of the received signal.

In the example of the Gray coding scheme, if the received signal is less than all of the reference voltages 315, the decoder 320 may determine that a logic state '00' is represented by the received signal. If the received signal is greater than one reference voltage 315 but less than two of the reference voltages 315, the decoder 320 may determine that a logic state '01' is represented by the received signal. If the received signal is greater than two of the reference voltages 315 but less than one of the reference voltages 315, the decoder 320 may determine that a logic state '11' is represented by the received signal. If the received signal is greater than all of the reference voltages 315, the decoder 320 may determine that a logic state '10' is represented by the received signal. It should be appreciated that the mapping of logic states to amplitudes may be modified based on design choices.

The decoder 320 may be configured to output bit information corresponding to the logic state of the received signal to the controller 325-*a* (e.g., via one or more conductive lines 330). For example, the bit information may indicate respective states of the bits of the logic state. In some examples, to output the bit information, the decoder 320 may output a first signal on a conductive line 330-*a* and second signal on a conductive line 330-*b*, where the first signal may in some examples correspond to a state of a most significant bit of the bits of the logic state and the second signal may in some examples correspond to a state of a least significant bit of the bits of the logic state. Additionally or alternatively, the decoder 320 may output a signal on the conductive line 330-*a* that indicates the respective states of the bits of the logic state (e.g., for example using a signal that indicates at least two respective states of bits of one or more logic states). In some cases, a quantity of conductive lines 330 used to output the bit information may be based on a quantity of samplers used to sample the received signal. For example, the quantity of conductive lines may be some multiple of the quantity of samplers (e.g., the quantity of conductive lines may be double the quantity of samplers).

The controller 325-*a* may compare the bit information to expected bit information corresponding to the bit information in order to verify the outputs of the comparators 310. The expected bit information may include respective expected states of the bits of the logic state. If at least one state of the bit information is different than a state of a corresponding bit of the expected bit information, the controller 325-*a* may determine that at least one of the comparator 310 outputs was incorrect. In some cases, the controller 325-*a* may use one or more XOR gates to compare the bit information to the expected bit information. However, if the controller 325-*a* uses the one or more XOR gates, the controller 325-*a* may not know which output of the comparators 310 was incorrect. To determine a performance of the comparators 310 (e.g., to determine which comparator 310 failed using an associated reference voltage 315 and sample time) and to adjust corresponding reference voltage 315 used by the comparator 310, the controller 325-*a* may perform testing using one comparator 310 at a time. But using one comparator 310 at a time may increase latency associated with determining the performance of the comparators 310. Additionally, using one comparator 310 at a time may increase complexity of the testing as data read using one comparator 310 may be different than the corresponding expected data. Thus, different sets of expected bit information may be generated to test each comparator 310.

To reduce latency and complexity associated with determining the performance of the comparators 310, the controller 325-*a* may compare the bit information to the expected bit information using one or more lookup tables. For example, the controller 325-*a* may program a lookup table to disregard some bit failures and count other bit failures. The controller 325-*a* may program the lookup table such that the counted bit failures characterize the performance of a particular comparator 310 (e.g., a data eye corresponding to the comparator 310 may be generated).

Figure 3B:
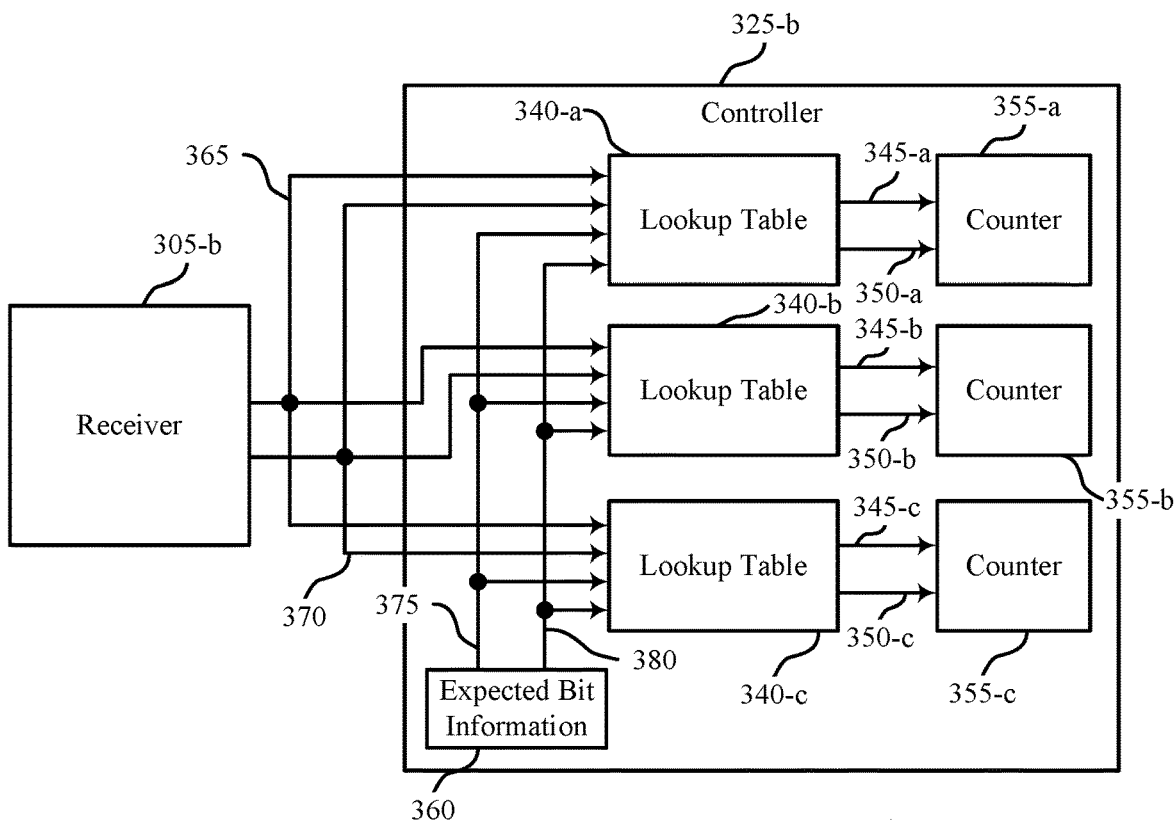

FIG. 3B illustrates an example of a circuit 335 that supports a fail compare procedure in accordance with examples as disclosed herein. The circuit 335 may include a receiver 305-*b* and a controller 325-*b*, which may be respective examples of the receiver 305-*a* and the controller 325-*a*, as described with reference to FIG. 3A. The receiver 305-*b* and the controller 325-*b* may be included in an ASIC that is coupled with or included in a host device 105 or an external memory controller 120 as described with reference to FIG. 1.

The receiver 305-*b* may be configured to output bit information to the controller 325-*b* based on a received signal. For example, the receiver 305-*b* may output a bit sequence (e.g., on one or more conductive lines) to the controller 325-*b* indicating respective states for at least two bits. For illustrative purposes, FIG. 3B depicts the bit information including a most significant bit 365 and a least significant bit 370, however the principles disclosed below may be adapted and applied for the bit information to indicate respective states of any quantity of bits as well.

The controller 325-*b* may be configured to receive and verify the bit information. For example, the controller 325-*b* may use one or more lookup tables 340 to compare the bit information to expected bit information 360 that includes respective expected states of the at least two bits of the bit information (e.g., expected state 375 of the most significant bit 365 and expected state 380 of the least significant bit 370). For example, to compare the bit information to the expected bit information 360, the controller 325-*b* may populate a lookup table 340-*a* with a set of values associated with the bit information and the expected bit information 360. The controller 325-*b* may write the bit information and the expected bit information 360 into the lookup table 340-*a* and may compare the bit information to the expected bit information 360 according to the populated set of values. For example, the controller 325-*b* may program the lookup table 340-*a* such that the controller 325-*b* may disregard one or more bit fails and count one or more other bit fails. In some examples, a bit fail may include the expected state 375 being different than the state of the most significant bit 365, the expected state 380 being different than the state of the least significant bit 370, mismatches between various combinations of the states of most significant bit 365 and least significant bit 370 and the expected states 375, 380, or some other difference between states of bits of the bit information and respective states of bits of the expected bit information.

The controller 325-*b* may program the lookup table 340-*a* to characterize a performance of a particular comparator of the receiver 305-*b*. For example, particular bit fails may indicate a failure of a particular comparator of the receiver 305-*b*. The controller 325-*b* may program the lookup table 340-*a* to count bit fails indicating the failure of a selected comparator and disregard bit fails indicating failures of other comparators. In this way, the counted failures may be used to generate a data eye (e.g., a data eye described with reference to FIG. 2) corresponding to the performance of the selected comparator.

After comparing the bit information to the expected bit information 360, the controller 325-*b* may output one or more signals indicating a failed read or a successful read of a bit to one or more counters 355. For example, based on the comparison, the controller 325-*b* may output a fail indicator 345 or a success indicator 350 for each compared bit to a corresponding counter 355. For example, for each bit of the bit information, the controller may output a fail indicator 345-*a* or a success indicator 350-*a* to the counter 355-*a* based on the comparison using the lookup table 340-*a*. In some examples, based on programming the lookup table 340-*a*, the controller may output a success indicator 350-*a* instead of a fail indicator 345-*a* if the lookup table 340-*a* is programmed to disregard a particular bit fail. Here, the counter 355-*a* may increment a count corresponding to successfully read bits based on receiving the success indicator 350-*a*.

In response to a bit fail, the receiver 305-*b* may adjust a reference voltage or a sample time used by a comparator associated with the bit fail. By tracking the reference voltages and sample times used and the bit fails or successes corresponding to the reference voltages and sample times, the controller 325-*b* may generate a data eye to characterize the performance of the comparator.

The controller 325-*b* may use more than one lookup table 340 to compare the bit information to the expected bit information 360. For example, the controller 325-*b* may write the bit information and the expected bit information 360 into the lookup table 340-*a*, a lookup table 340-*b*, and a lookup table 340-*c* and may compare the bit information to the expected bit information 360 using the lookup table 340-*a*, the lookup table 340-*b*, and the lookup table 340-*c*. Based on the comparison at each lookup table 340, the controller may output one or more fail indicators 345-*a*, 345-*b*, and 345-*c* or one or more success indicators 350-*a*, 350-*b*, and 350-*c*, to a corresponding counter 355-*a*, 355-*b*, and 355-*c*. In some examples, the controller 325-*b* may concurrently write the bit information and the expected bit information 360 into each of the lookup tables 340 and concurrently compare the bit information to the expected bit information 360 using each of the lookup tables 340.

The controller 325-*b* may independently program each lookup table 340 to disregard different bit fails. For example, the controller 325-*b* may program the lookup table 340-*a* to disregard a first set of bit fails, the lookup table 340-*b* to disregard a second set of bit fails, and the lookup table 340-*c* to disregard a third set of bit fails. Accordingly, the lookup tables 340 may each compare the same bit information to the same expected bit information 360, but may output different fail indicators 345 and success indicators 350 based on how each lookup table 340 is programmed. Accordingly, each lookup table 340 may be programmed to characterize the performance of a different comparator. In this way, the circuit 335 may be used to reduce latency and complexity associated with characterizing the performance of a set of comparators by characterizing the performance of more than one comparator of the set of comparators and using a same set of expected bit information 360 to characterize the performance of the set of comparators.

While the bit information includes two bits in the examples described herein, the bit information may include any quantity of bits conveyed by a multi-level signal. For example, the logic state represented by the received signal may include states of three or more bits. Here, the receiver 305-*b* may output bit information corresponding to the three or more bits and the controller 325-*b* may use any quantity of lookup tables 340 and counters 355 to characterize the performance of a corresponding set of comparators of the receiver 305-*b*.

Figure 4:
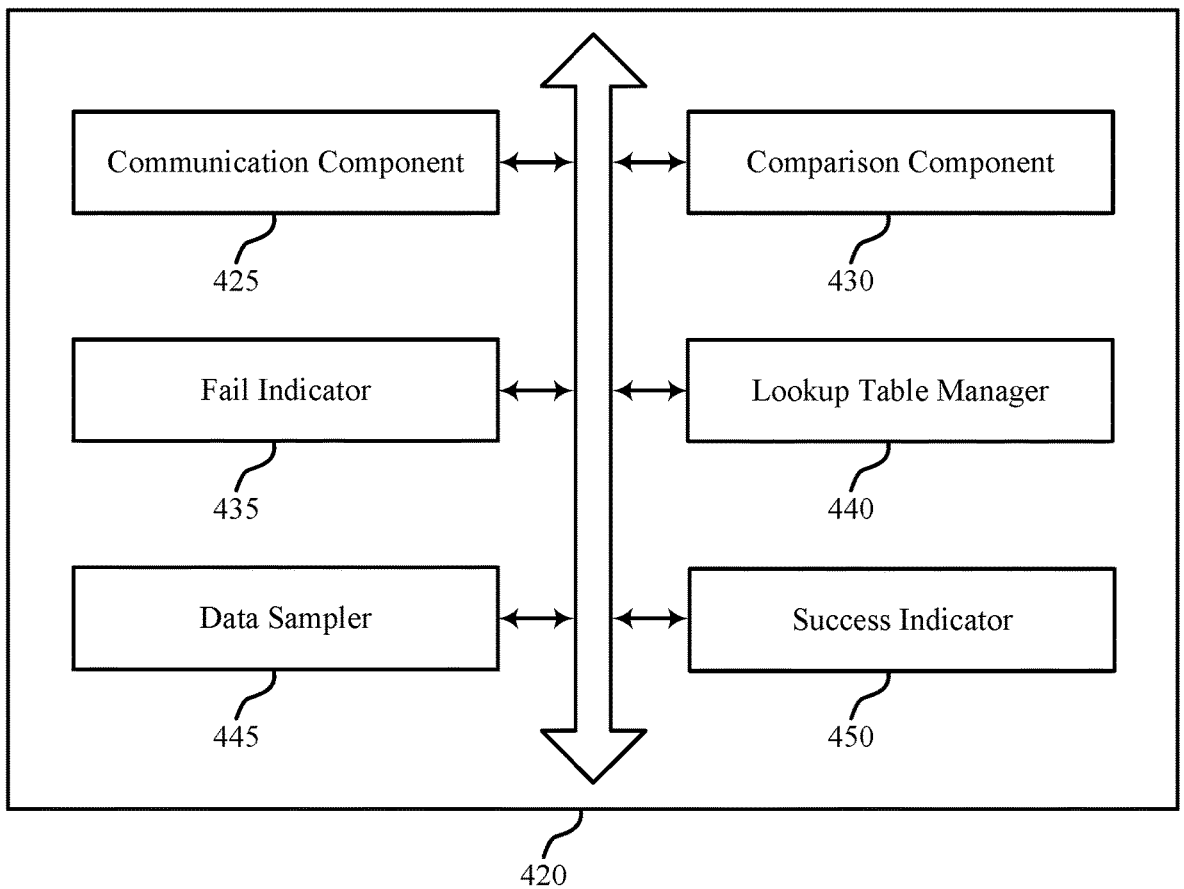
FIG. 4 shows a block diagram of a system that supports fail compare procedure in accordance with examples as disclosed herein.

FIG. 4 shows a block diagram 400 of a system 420 that supports a fail compare procedure in accordance with examples as disclosed herein. The system 420 may be an example of aspects of a system as described with reference to FIGS. 1 through 3. The system 420, or various components thereof, may be an example of means for performing various aspects of fail compare procedure as described herein. For example, the system 420 may include a communication component 425, a comparison component 430, a fail indicator 435, a lookup table manager 440, a data sampler 445, a success indicator 450, or any combination thereof. Each of these components may communicate, directly or indirectly, with one another (e.g., via one or more buses).

The communication component 425 may be configured as or otherwise support a means for receiving, from a set of comparators of an ASIC, signaling including first bit information indicating respective states of at least two bits. The comparison component 430 may be configured as or otherwise support a means for comparing, at the ASIC, the first bit information to second bit information to determine whether a state of at least one bit of the first bit information is different than a state of a corresponding bit of the second bit information, the second bit information including respective expected states of the at least two bits. The fail indicator 435 may be configured as or otherwise support a means for outputting one or more signals including indications of a fail to a counter of the ASIC based at least in part on comparing the first bit information to the second bit information.

In some examples, the lookup table manager 440 may be configured as or otherwise support a means for populating a lookup table with a set of values associated with the first bit information and the second bit information, where comparing the first bit information to the second bit information is based at least in part on populating the lookup table.

In some examples, the lookup table manager 440 may be configured as or otherwise support a means for programming the lookup table to disregard a fail of a first bit of the first bit information, where the fail of the first bit of the first bit information includes a state of the first bit of the first bit information being different than a state of a first corresponding bit of the second bit information.

In some examples, the success indicator 450 may be configured as or otherwise support a means for outputting one or more signals including indications of a successful read of the first bit of the first bit information to the counter based at least in part on programming the lookup table to disregard the fail of the first bit of the first bit information.

In some examples, the communication component 425 may be configured as or otherwise support a means for writing the first bit information and the second bit information into the lookup table, where comparing the second bit information to the first bit information using the lookup table is based at least in part on writing the first bit information and the second bit information into the lookup table.

In some examples, the lookup table manager 440 may be configured as or otherwise support a means for populating a set of lookup tables with respective sets of values associated with the first bit information and the second bit information, where comparing the first bit information to the second bit information is based at least in part on populating the set of lookup tables.

In some examples, the lookup table manager 440 may be configured as or otherwise support a means for programming a first lookup table of the set to disregard a first fail of a first bit of the first bit information, where the first fail of the first bit of the first bit information includes a first state of the first bit of the first bit information being different than a first state of a first corresponding bit of the second bit information. In some examples, the lookup table manager 440 may be configured as or otherwise support a means for programming a second lookup table of the set to disregard a second fail of a second bit of the first bit information, where the second fail of the second bit of the first bit information includes a second state of the second bit of the first bit information being different than a second state of a second corresponding bit of the second bit information.

In some examples, the success indicator 450 may be configured as or otherwise support a means for outputting one or more signals including indications of a first successful read of the first bit of the first bit information to the counter based at least in part on programming the first lookup table to disregard the first fail of the first bit of the first bit information. In some examples, the success indicator 450 may be configured as or otherwise support a means for outputting one or more signals including indications of a second successful read of the second bit of the first bit information to the counter based at least in part on programming the second lookup table to disregard the second fail of the second bit of the first bit information.

In some examples, the communication component 425 may be configured as or otherwise support a means for writing the first bit information and the second bit information into each lookup table of the set, where comparing the second bit information to the first bit information using the set is based at least in part on writing the first bit information and the second bit information into each lookup table of the set.

In some examples, the data sampler 445 may be configured as or otherwise support a means for sampling data based at least in part on one or more reference points, where receiving the first bit information is based at least in part on sampling the data.

In some examples, the data sampler 445 may be configured as or otherwise support a means for adjusting the one or more reference points based at least in part on outputting the one or more indications of the fail to the counter, where the one or more reference points include a time reference point, or a voltage reference point, or a combination thereof.

In some examples, the one or more indications of the fail include one or more indications of a failed read operation of at least one bit of the first bit information.

In some examples, the first bit information includes a first state of a most significant bit of a bit sequence received from the set of comparators and a second state of a least significant bit of the bit sequence. In some examples, the second bit information includes an expected state of the most significant bit of the bit sequence and an expected state of the least significant bit of the bit sequence.

Figure 5:
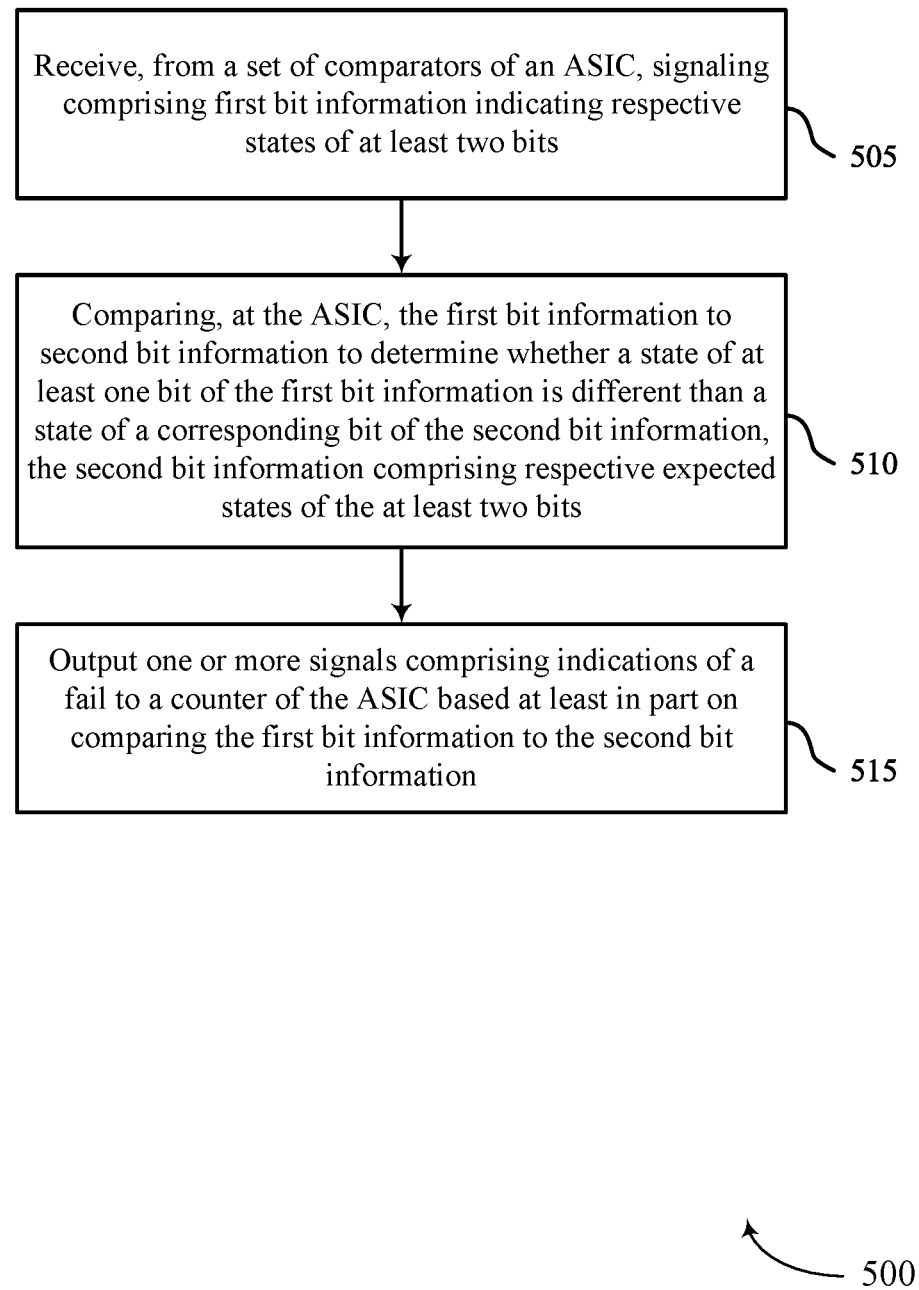
FIG. 5 shows a flowchart illustrating a method or methods that support fail compare procedure in accordance with examples as disclosed herein.

FIG. 5 shows a flowchart illustrating a method 500 that supports a fail compare procedure in accordance with examples as disclosed herein. The operations of method 500 may be implemented by a system or its components as described herein. For example, the operations of method 500 may be performed by a system as described with reference to FIGS. 1 through 4. In some examples, a system may execute a set of instructions to control the functional elements of the device to perform the described functions. Additionally or alternatively, the system may perform aspects of the described functions using special-purpose hardware.

At 505, the method may include receiving, from a set of comparators of an ASIC, signaling including first bit information indicating respective states of at least two bits. The operations of 505 may be performed in accordance with examples as described with reference to FIGS. 3A and 3B. In some examples, aspects of the operations of 505 may be performed by a communication component 425 as described with reference to FIG. 4.

At 510, the method may include comparing, at the ASIC, the first bit information to second bit information to determine whether a state of at least one bit of the first bit information is different than a state of a corresponding bit of the second bit information, the second bit information including respective expected states of the at least two bits. The operations of 510 may be performed in accordance with examples as described with reference to FIG. 3B. In some examples, aspects of the operations of 510 may be performed by a comparison component 430 as described with reference to FIG. 4.

At 515, the method may include outputting one or more signals including indications of a fail to a counter of the ASIC based at least in part on comparing the first bit information to the second bit information. The operations of 515 may be performed in accordance with examples as described with reference to FIG. 3B. In some examples, aspects of the operations of 515 may be performed by a fail indicator 435 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for receiving, from a set of comparators of an ASIC, signaling including first bit information indicating respective states of at least two bits, comparing, at the ASIC, the first bit information to second bit information to determine whether a state of at least one bit of the first bit information is different than a state of a corresponding bit of the second bit information, the second bit information including respective expected states of the at least two bits, and outputting one or more signals including indications of a fail to a counter of the ASIC based at least in part on comparing the first bit information to the second bit information.

Some examples of the method 500 and the apparatus described herein may further include operations, features, circuitry, logic, means, or instructions for populating a lookup table with a set of values associated with the first bit information and the second bit information, where comparing the first bit information to the second bit information may be based at least in part on populating the lookup table.

Some examples of the method 500 and the apparatus described herein may further include operations, features, circuitry, logic, means, or instructions for programming the lookup table to disregard a fail of a first bit of the first bit information, where the fail of the first bit of the first bit information includes a state of the first bit of the first bit information being different than a state of a first corresponding bit of the second bit information.

Some examples of the method 500 and the apparatus described herein may further include operations, features, circuitry, logic, means, or instructions for outputting one or more signals including indications of a successful read of the first bit of the first bit information to the counter based at least in part on programming the lookup table to disregard the fail of the first bit of the first bit information.

Some examples of the method 500 and the apparatus described herein may further include operations, features, circuitry, logic, means, or instructions for writing the first bit information and the second bit information into the lookup table, where comparing the second bit information to the first bit information using the lookup table may be based at least in part on writing the first bit information and the second bit information into the lookup table.

Some examples of the method 500 and the apparatus described herein may further include operations, features, circuitry, logic, means, or instructions for populating a set of lookup tables with respective sets of values associated with the first bit information and the second bit information, where comparing the first bit information to the second bit information may be based at least in part on populating the set of lookup tables.

Some examples of the method 500 and the apparatus described herein may further include operations, features, circuitry, logic, means, or instructions for programming a first lookup table of the set to disregard a first fail of a first bit of the first bit information, where the first fail of the first bit of the first bit information includes a first state of the first bit of the first bit information being different than a first state of a first corresponding bit of the second bit information and programming a second lookup table of the set to disregard a second fail of a second bit of the first bit information, where the second fail of the second bit of the first bit information includes a second state of the second bit of the first bit information being different than a second state of a second corresponding bit of the second bit information.

Some examples of the method 500 and the apparatus described herein may further include operations, features, circuitry, logic, means, or instructions for outputting one or more signals including indications of a first successful read of the first bit of the first bit information to the counter based at least in part on programming the first lookup table to disregard the first fail of the first bit of the first bit information and outputting one or more signals including indications of a second successful read of the second bit of the first bit information to the counter based at least in part on programming the second lookup table to disregard the second fail of the second bit of the first bit information.

Some examples of the method 500 and the apparatus described herein may further include operations, features, circuitry, logic, means, or instructions for writing the first bit information and the second bit information into each lookup table of the set, where comparing the second bit information to the first bit information using the set may be based at least in part on writing the first bit information and the second bit information into each lookup table of the set.

Some examples of the method 500 and the apparatus described herein may further include operations, features, circuitry, logic, means, or instructions for sampling data based at least in part on one or more reference points, where receiving the first bit information may be based at least in part on sampling the data.

Some examples of the method 500 and the apparatus described herein may further include operations, features, circuitry, logic, means, or instructions for adjusting the one or more reference points based at least in part on outputting the one or more indications of the fail to the counter, where the one or more reference points include a time reference point, or a voltage reference point, or a combination thereof.

In some examples of the method 500 and the apparatus described herein, the one or more indications of the fail include one or more indications of a failed read operation of at least one bit of the first bit information.

In some examples of the method 500 and the apparatus described herein, the first bit information includes a first state of a most significant bit of a bit sequence received from the set of comparators and a second state of a least significant bit of the bit sequence and the second bit information includes an expected state of the most significant bit of the bit sequence and an expected state of the least significant bit of the bit sequence.

It should be noted that the methods described herein describe possible implementations, and that the operations and the steps may be rearranged or otherwise modified and that other implementations are possible. Further, portions from two or more of the methods may be combined.

Another apparatus is described. The apparatus may include an ASIC including a set of comparators and a controller coupled with the set of comparators and operable to cause the apparatus to receive, from the set of comparators, signaling including first bit information indicating respective states of at least two bits, compare, at the ASIC, the second bit information to the first bit information to determine whether a state of at least one bit of the first bit information is different than a state of a corresponding bit of the second bit information, the second bit information including respective expected states of the at least two bits, and output one or more signals including indications of a fail to a counter of the ASIC based at least in part on the comparing In some examples, the apparatus may include populate a lookup table with a set of values associated with the first bit information and the second bit information, where comparing the first bit information to the second bit information may be based at least in part on populating the lookup table.

In some examples, the apparatus may include program the lookup table to disregard a fail of a first bit of the first bit information, where the fail of the first bit of the first bit information includes a state of the first bit of the first bit information being different than a state of a first corresponding bit of the second bit information.

In some examples of the apparatus, the controller may be further operable to cause the apparatus to output one or more signals including indications of a successful read of the first bit of the first bit information to the counter based at least in part on programming the lookup table to disregard the fail of the first bit of the first bit information.

In some examples, the apparatus may include write the first bit information and the second bit information into the lookup table, where comparing the second bit information to the first bit information using the lookup table may be based at least in part on writing the first bit information and the second bit information into the lookup table.

In some examples, the apparatus may include populate a set of lookup tables with respective sets of values associated with the first bit information and the second bit information, where comparing the first bit information to the second bit information may be based at least in part on populating the set of lookup tables.

In some examples, the apparatus may include program a first lookup table of the set to disregard a first fail of a first bit of the first bit information, where the first fail of the first bit of the first bit information includes a first state of the first bit of the first bit information being different than a first state of a first corresponding bit of the second bit information and program a second lookup table of the set to disregard a second fail of a second bit of the first bit information, where the second fail of the second bit of the first bit information includes a second state of the second bit of the first bit information being different than a second state of a second corresponding bit of the second bit information.

In some examples of the apparatus, the controller may be further operable to cause the apparatus to output one or more signals including indications of a first successful read of the first bit of the first bit information to the counter based at least in part on programming the first lookup table to disregard the first fail of the first bit of the first bit information and output one or more signals including indications of a second successful read of the second bit of the first bit information to the counter based at least in part on programming the second lookup table to disregard the second fail of the second bit of the first bit information.

In some examples, the apparatus may include write the first bit information and the second bit information into each lookup table of the set, where comparing the second bit information to the first bit information using the set may be based at least in part on writing the first bit information and the second bit information into each lookup table of the set.

In some examples of the apparatus, the controller may be further operable to cause the apparatus to sample data based at least in part on one or more reference points, where receiving the first bit information may be based at least in part on sampling the data.

In some examples of the apparatus, the controller may be further operable to cause the apparatus to adjust the one or more reference points based at least in part on outputting the one or more indications of the fail to the counter, where the one or more reference points include a time reference point, or a voltage reference point, or a combination thereof.

In some examples of the apparatus, the one or more indications of the fail include one or more indications of a failed read operation of at least one bit of the first bit information.

In some examples of the apparatus, the first bit information includes a first state of a most significant bit of a bit sequence received from the set of comparators and a second state of a least significant bit of the bit sequence, and the second bit information includes an expected state of the most significant bit of the bit sequence and an expected state of the least significant bit of the bit sequence.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
  receiving, from a set of comparators of an application specific integrated circuit (ASIC), signaling comprising first bit information indicating respective states of at least two bits;
  populating a lookup table with a set of values associated with the first bit information and second bit information;
  comparing, at the ASIC and based at least in part on populating the lookup table, the first bit information to the second bit information to determine whether a state of at least one bit of the first bit information is different than a state of a corresponding bit of the second bit information, the second bit information comprising respective expected states of the at least two bits; and
  outputting one or more signals comprising indications of a fail to a counter of the ASIC based at least in part on comparing the first bit information to the second bit information.

2. The method of claim 1, further comprising:
  programming the lookup table to disregard a fail of a first bit of the first bit information, wherein the fail of the first bit of the first bit information comprises a state of the first bit of the first bit information being different than a state of a first corresponding bit of the second bit information.

3. The method of claim 2, further comprising:
  outputting one or more signals comprising indications of a successful read of the first bit of the first bit information to the counter based at least in part on programming the lookup table to disregard the fail of the first bit of the first bit information.

4. The method of claim 1, further comprising:
  writing the first bit information and the second bit information into the lookup table, wherein comparing the second bit information to the first bit information using the lookup table is based at least in part on writing the first bit information and the second bit information into the lookup table.

5. The method of claim 1, further comprising:
  sampling data based at least in part on one or more reference points, wherein receiving the first bit information is based at least in part on sampling the data.

6. The method of claim 5, further comprising:
  adjusting the one or more reference points based at least in part on outputting the one or more signals comprising indications of the fail to the counter, wherein the one or more reference points comprise a time reference point, or a voltage reference point, or a combination thereof.

7. The method of claim 1, wherein the one or more signals comprising indications of the fail comprise one or more indications of a failed read operation of at least one bit of the first bit information.

8. A method, comprising:
  receiving, from a set of comparators of an application specific integrated circuit (ASIC), signaling comprising first bit information indicating respective states of at least two bits;
  populating a set of lookup tables with respective sets of values associated with the first bit information and second bit information;
  comparing, at the ASIC and based at least in part on populating the set of lookup tables, the first bit information to the second bit information to determine whether a state of at least one bit of the first bit information is different than a state of a corresponding bit of the second bit information, the second bit information comprising respective expected states of the at least two bits; and
  outputting one or more signals comprising indications of a fail to a counter of the ASIC based at least in part on comparing the first bit information to the second bit information.

9. The method of claim 8, further comprising:
  programming a first lookup table of the set of lookup tables to disregard a first fail of a first bit of the first bit information, wherein the first fail of the first bit of the first bit information comprises a first state of the first bit of the first bit information being different than a first state of a first corresponding bit of the second bit information; and programming a second lookup table of the set of lookup tables to disregard a second fail of a second bit of the first bit information, wherein the second fail of the second bit of the first bit information comprises a second state of the second bit of the first bit information being different than a second state of a second corresponding bit of the second bit information.

10. The method of claim 9, further comprising:

outputting one or more signals comprising indications of a first successful read of the first bit of the first bit information to the counter based at least in part on programming the first lookup table to disregard the first fail of the first bit of the first bit information; and outputting one or more signals comprising indications of a second successful read of the second bit of the first bit information to the counter based at least in part on programming the second lookup table to disregard the second fail of the second bit of the first bit information.

11. The method of claim 8, further comprising:

writing the first bit information and the second bit information into each lookup table of the set of lookup tables, wherein comparing the second bit information to the first bit information using the set of lookup tables is based at least in part on writing the first bit information and the second bit information into each lookup table of the set of lookup tables.

12. A method comprising:

receiving, from a set of comparators of an application specific integrated circuit (ASIC), signaling comprising first bit information indicating respective states of at least two bits, wherein the first bit information comprises a first state of a most significant bit of a bit sequence received from the set of comparators and a second state of a least significant bit of the bit sequence;

comparing, at the ASIC, the first bit information to second bit information to determine whether a state of at least one bit of the first bit information is different than a state of a corresponding bit of the second bit information, wherein the second bit information comprises an expected state of the most significant bit of the bit sequence and an expected state of the least significant bit of the bit sequence; and outputting one or more signals comprising indications of a fail to a counter of the ASIC based at least in part on comparing the first bit information to the second bit information.

13. An apparatus, comprising:

an application specific integrated circuit (ASIC) comprising a set of comparators; and a controller coupled with the set of comparators and operable to cause the apparatus to:

receive, from the set of comparators, signaling comprising first bit information indicating respective states of at least two bits;

populate a lookup table with a set of values associated with the first bit information and second bit information;

compare, at the ASIC and based at least in part on populating the lookup table, the first bit information to the second bit information to determine whether a state of at least one bit of the first bit information is different than a state of a corresponding bit of the second bit information, the second bit information comprising respective expected states of the at least two bits; and output one or more signals comprising indications of a fail to a counter of the ASIC based at least in part on comparing the first bit information to the second bit information.

14. The apparatus of claim 13, wherein the controller is further operable to cause the apparatus to:

program the lookup table to disregard a fail of a first bit of the first bit information, wherein the fail of the first bit of the first bit information comprises a state of the first bit of the first bit information being different than a state of a first corresponding bit of the second bit information.

15. The apparatus of claim 14, wherein the controller is further operable to cause the apparatus to:

output one or more signals comprising indications of a successful read of the first bit of the first bit information to the counter based at least in part on programming the lookup table to disregard the fail of the first bit of the first bit information.

16. The apparatus of claim 13, wherein the controller is further operable to cause the apparatus to:

write the first bit information and the second bit information into the lookup table, wherein comparing the second bit information to the first bit information using the lookup table is based at least in part on writing the first bit information and the second bit information into the lookup table.

17. The apparatus of claim 13, wherein the controller is further operable to cause the apparatus to:

sample data based at least in part on one or more reference points, wherein receiving the first bit information is based at least in part on sampling the data.

18. An apparatus, comprising:

an application specific integrated circuit (ASIC) comprising a set of comparators; and a controller coupled with the set of comparators and operable to cause the apparatus to:

receive, from the set of comparators, signaling comprising first bit information indicating respective states of at least two bits;

populate a set of lookup tables with respective sets of values associated with the first bit information and second bit information;

compare, at the ASIC and based at least in part on populating the set of lookup tables, the first bit information to the second bit information to determine whether a state of at least one bit of the first bit information is different than a state of a corresponding bit of the second bit information, the second bit information comprising respective expected states of the at least two bits; and output one or more signals comprising indications of a fail to a counter of the ASIC based at least in part on comparing the first bit information to the second bit information.

19. The apparatus of claim 18, wherein the controller is further operable to cause the apparatus to:

program a first lookup table of the set of lookup tables to disregard a first fail of a first bit of the first bit information, wherein the first fail of the first bit of the first bit information comprises a first state of the first bit of the first bit information being different than a first state of a first corresponding bit of the second bit information; and program a second lookup table of the set of lookup tables to disregard a second fail of a second bit of the first bit information, wherein the second fail of the second bit of the first bit information comprises a second state of the second bit of the first bit information being different than a second state of a second corresponding bit of the second bit information.

20. The apparatus of claim 19, wherein the controller is further operable to cause the apparatus to:
output one or more signals comprising indications of a first successful read of the first bit of the first bit information to the counter based at least in part on programming the first lookup table to disregard the first fail of the first bit of the first bit information; and
output one or more signals comprising indications of a second successful read of the second bit of the first bit information to the counter based at least in part on programming the second lookup table to disregard the second fail of the second bit of the first bit information.

21. The apparatus of claim 18, wherein the controller is further operable to cause the apparatus to:
write the first bit information and the second bit information into each lookup table of the set of lookup tables, wherein comparing the second bit information to the first bit information using the set of lookup tables is based at least in part on writing the first bit information and the second bit information into each lookup table of the set of lookup tables.

22. A non-transitory computer-readable medium storing code, the code comprising instructions executable by a processor to:
receive, from a set of comparators of an application specific integrated circuit (ASIC), signaling comprising first bit information indicating respective states of at least two bits;
populate a lookup table with a set of values associated with the first bit information and second bit information;
compare, at the ASIC and based at least in part on populating the lookup table, the first bit information to the second bit information to determine whether a state of at least one bit of the first bit information is different than a state of a corresponding bit of the second bit information, the second bit information comprising respective expected states of the at least two bits; and
output one or more signals comprising indications of a fail to a counter of the ASIC based at least in part on comparing the first bit information to the second bit information.

* * * * *